(12) United States Patent
Rios-Baez et al.

(10) Patent No.: US 7,127,650 B2
(45) Date of Patent: Oct. 24, 2006

(54) TEST METHOD AND TEST DEVICE FOR ELECTRONIC MEMORIES

(75) Inventors: Abel Rios-Baez, München (DE); Michael Kund, Tuntenhausen (DE)

(73) Assignee: Infineon Technologies AG, Munich (DE)

( * ) Notice: Subject to any disclaimer, the term of this patent is extended or adjusted under 35 U.S.C. 154(b) by 505 days.

(21) Appl. No.: 10/195,598

(22) Filed: Jul. 11, 2002

(65) Prior Publication Data

US 2003/0065998 A1 Apr. 3, 2003

(30) Foreign Application Priority Data

Jul. 11, 2001 (DE) ................................ 101 33 689

(51) Int. Cl.
*G11C 29/00* (2006.01)

(52) U.S. Cl. ..................... 714/722; 714/724; 714/718; 714/738

(58) Field of Classification Search ................ 714/724, 714/704, 720, 721, 738, 42, 763, 39, 47, 714/718, 722, 54; 375/265
See application file for complete search history.

(56) References Cited

U.S. PATENT DOCUMENTS

| | | | | |
|---|---|---|---|---|
| 4,061,908 A | * | 12/1977 | DE Jonge et al. | 714/720 |
| 4,393,475 A | * | 7/1983 | Kitagawa et al. | 365/185.21 |
| 4,841,525 A | * | 6/1989 | Lieske et al. | 714/720 |
| 5,436,910 A | * | 7/1995 | Takeshima et al. | 714/718 |
| 5,483,488 A | * | 1/1996 | Sanada | 365/189.03 |
| 5,983,372 A | * | 11/1999 | Fujiwara | 714/704 |
| 6,246,723 B1 | * | 6/2001 | Bliss et al. | 375/265 |
| 6,351,835 B1 | * | 2/2002 | Sakaguchi | 714/724 |
| 6,584,589 B1 | * | 6/2003 | Perner et al. | 714/721 |
| 6,651,204 B1 | * | 11/2003 | Rajsuman et al. | 714/738 |

OTHER PUBLICATIONS

C. Thibeault: "Using sinusoidal stimuli and Fournier analyses for memory IC testing", *Records of the IEEE International Workshop on Memory Technology, Design and Testing*, Aug. 8-9, 1994, pp. 92-97.

* cited by examiner

*Primary Examiner*—Albert Decady
*Assistant Examiner*—Fritz Alphonse
(74) *Attorney, Agent, or Firm*—Laurence A. Greenberg; Werner H. Stemer; Ralph E. Locher

(57) ABSTRACT

A test method for electronic memories includes reading out a previously defined test pattern sequentially as a time-dependent signal from the memory, determining the associated spectrum from the time-dependent signal by Fourier transformation, and assessing the memory to be tested using the spectrum. Also included is a suitable test device for the method.

31 Claims, 2 Drawing Sheets

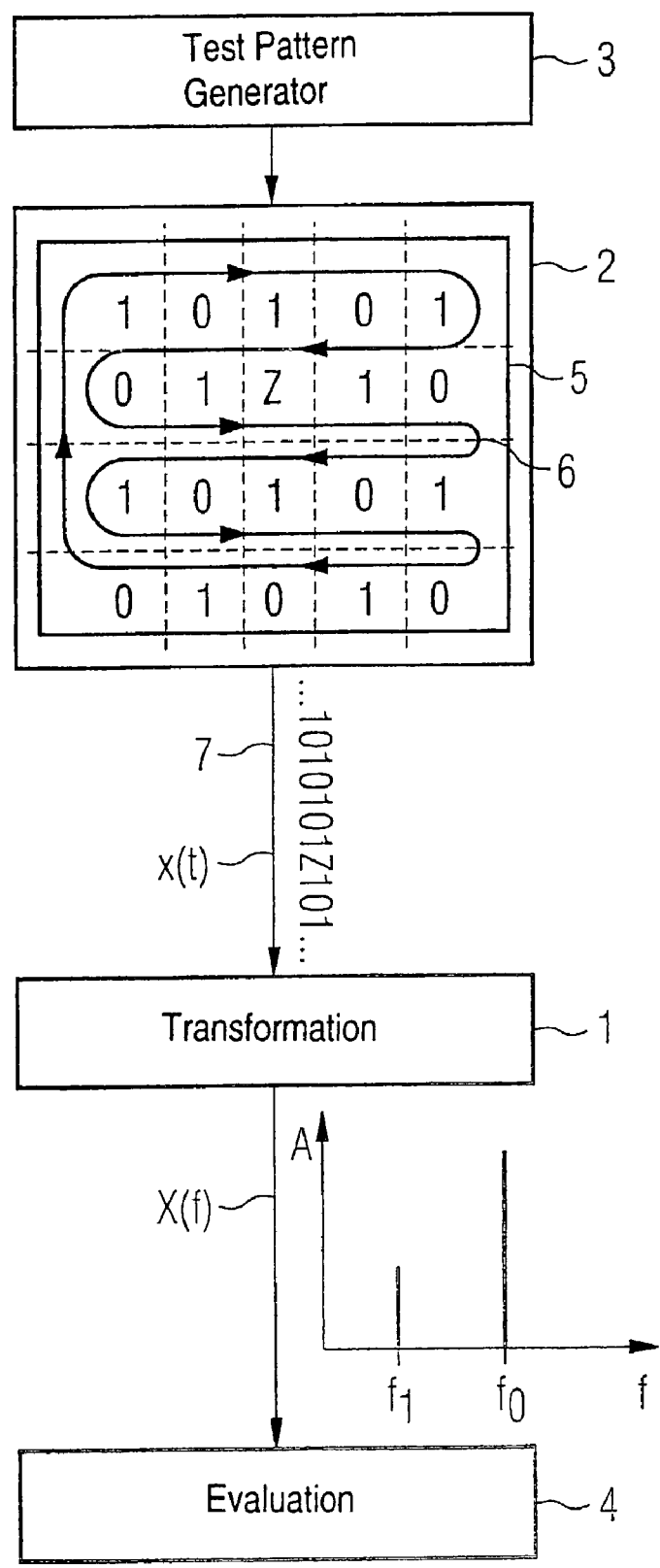

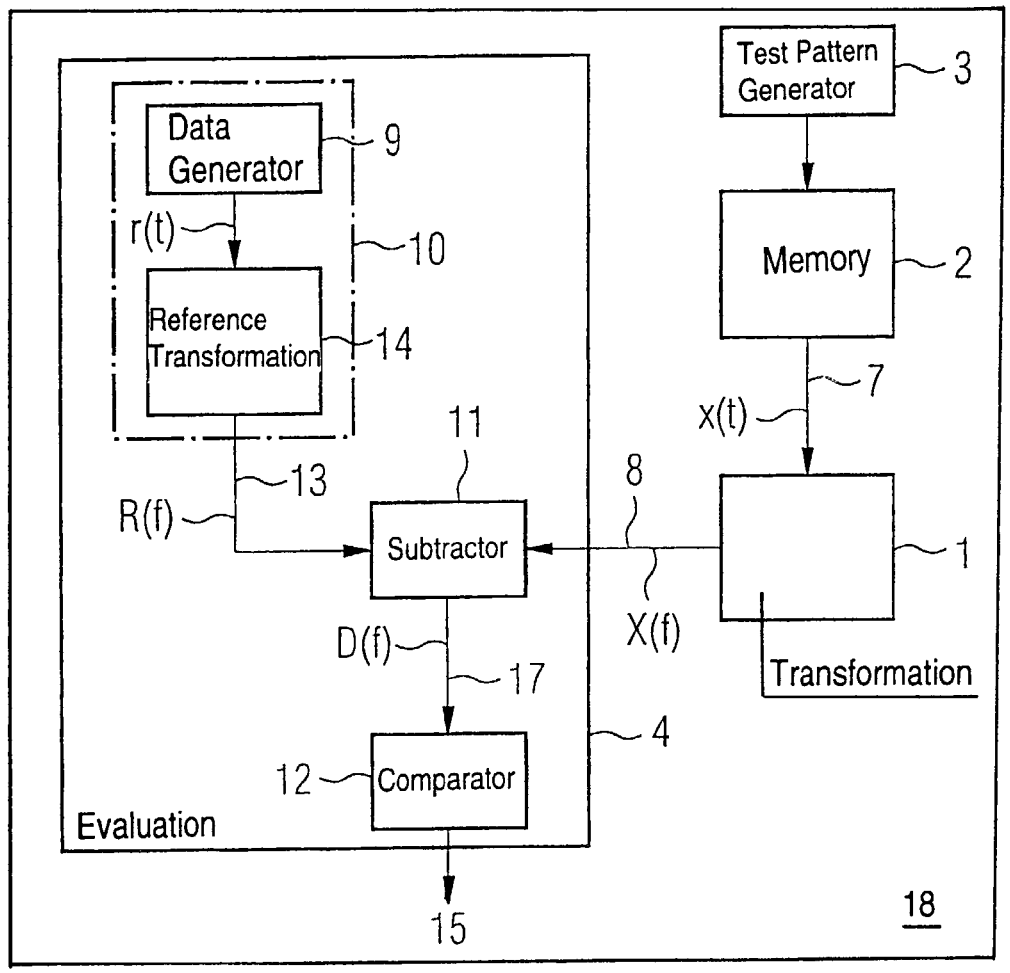
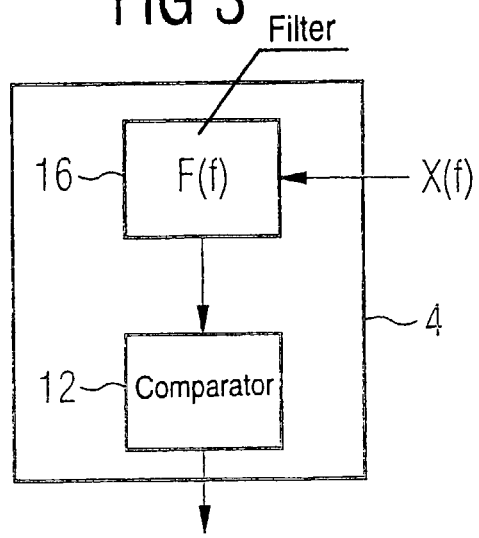

TEST METHOD AND TEST DEVICE FOR ELECTRONIC MEMORIES

BACKGROUND OF THE INVENTION

Field of the Invention

The invention relates to a method for testing an electronic memory having memory cells and a test device for testing electronic memories having memory cells.

Electronic memories are usually tested by defined data records in the form of so-called test patterns being written to the memory and subsequently being read out again. The memory is assessed based upon the correspondence between the data read out and the predetermined test pattern, the memory being deemed to be defect-free in the event of complete correspondence. To detect various malfunctions, memories are generally tested a number of times with different test patterns.

These tests are in part carried out at very high transmission speeds with a data throughput of up to 800 Mbit/s, in order, on one hand, to check the functioning of the memory at these high transmission rates and, on the other hand, to keep the test times short, the test times being associated with high costs. However, such fast test methods require complex test devices. In particular, the exact synchronization between test device and memory that is required for the comparison of test pattern and data record read out entails a considerable technical complexity.

Furthermore, an inadequate synchronization leads to synchronization errors between test device and memory and, thus, to defective test results, which reduce the yield of defect-free memories.

SUMMARY OF THE INVENTION

It is accordingly an object of the invention to provide a test method and test device for electronic memories that overcome the hereinafore-mentioned disadvantages of the heretofore-known devices and methods of this general type and that improves the testing method for electronic memories that, in particular, can be carried out with little technical complexity, and to provide such a suitable device for such testing.

With the foregoing and other objects in view, there is provided, in accordance with the invention, a method for testing an electronic memory having memory cells, including the steps of selecting a memory area of the memory, the memory area including at least some of the memory cells, sequentially reading out content of the memory cells in the selected memory area in a defined order through a common output to present the read out content at the output as a time-dependent signal, Fourier transforming the time-dependent signal into a spectrum, and generating a test result in a manner dependent on the spectrum.

In the test method according to the invention, provision is made firstly for defining, in the memory to be tested, a memory area that is intended to be subjected to the test, in which case the memory area may include some of the memory cells or else all the memory cells of the memory.

In the following step, a test pattern is generated by a test pattern generator and written to the memory cells of the selected memory area. If read-only memories (ROMs) are tested by the method according to the invention, then such a step can be dispensed with. In such a case, the defined memory content of the read-only memory is simultaneously used as test pattern.

Afterward, the memory cells of the test area are read sequentially in a temporally predetermined order through a common output so that the memory content of the defined memory area is present as time-dependent signal x(t) at the output.

In the next step, the associated spectrum X(f) is determined from the time-dependent signal x(t) by Fourier transformation.

In such a case, a Fourier transformation is to be understood as a transformation whose result indicates the frequency distribution of the time-dependent signal x(t) for a selected frequency range or individual selected frequencies. What is preferably suitable therefor is a transformation from the time domain into the frequency domain that is based on the following specification:

$$X(f) = \int_{-\infty}^{\infty} x(t) e^{2\pi f t} dt$$

Furthermore, a Fourier transformation is also to be understood as the corresponding Fourier sine and Fourier cosine transformations and also the conventional numerical approximations and discretizations for Fourier transformations.

In accordance with another mode of the invention, a suitable conventional hardwired circuit can be used for the Fourier transformation. As an alternative, the signal x(t) can also be sampled and buffer-stored by a suitable conventional device, the spectrum X(f) subsequently being determined therefrom by a data processing program for Fourier transformation. Discrete and fast Fourier transformation algorithms, for example, Fast Fourier Transformation (FFT) algorithms, are preferably used for this.

Storage oscilloscopes in which devices and functionalities for Fourier transformation of the measurement signal are implemented are also suitable, for example, for the Fourier transformation. As measurement signal, the time-dependent signal x(t) is fed into the storage oscilloscope, temporally sampled, and Fourier-transformed.

In the subsequent step, a test result is generated using the spectrum X(f) determined and is output.

Such a method has the advantage that exact time synchronization between the test device and the memory is not required. As a result, the test complexity is significantly reduced. Furthermore, frequency-based measurement methods are generally less sensitive to intermittent incorrect synchronizations (Jitter) than time-based measurement methods. In this regard, to further increase the reliability of the test result, it is advantageous to cyclically read the test area a number of times. In such a case, malfunctions of individual memory cells become evident particularly clearly. In accordance with a further mode of the invention, a test result including two alternatives is generated, for example, in the form of a positive and a negative assessment of the memory to be tested. These alternatives are designated by "GOOD" or "DEFECTIVE" for short hereinafter.

For such a test result, the spectrum X(f) is compared with a reference spectrum R(f) and a difference spectrum D(f) is generated therefrom. A memory is assessed as "GOOD" if the amplitudes of the difference spectrum D(f) or the magnitudes thereof, in the frequency range considered, are smaller than a predetermined limit value λ; otherwise it is assessed as "DEFECTIVE". Thus a test result "GOOD" is generated if the following holds true within the frequency range $f_1 \leq f \leq f_2$ considered:

$$|D(f)| \leq \lambda.$$

As an alternative, for the assessment of the memory, the difference spectrum can be integrated over the frequency range considered, the memory being deemed to be defective if the integral exceeds a predetermined limit value. Thus, for a test result "GOOD", the inequality $$\int_{f1}^{f2} |D(f)| df \leq \lambda$$

must be satisfied. In such a case, the limit value $\lambda$ is adapted to the test criterion respectively used.

To determine the reference spectrum R(f), use is preferably made of a defect-free memory of the same configuration that has been tested beforehand by a conventional test method and whose spectrum X(f) is determined by a method according to the invention and is stored as reference spectrum R(f) for subsequent tests. Such a stored reference spectrum can advantageously be used for a plurality of subsequent test methods.

As an alternative, the test pattern can be output from the test pattern generator as time-dependent reference signal r(t) in a temporally predetermined order corresponding to the test method and subsequently be Fourier-transformed as described above, from which the spectrum of the test pattern is produced as reference spectrum R(f).

In accordance with an added feature of the invention, the Fourier transformations for the test spectrum X(f) and the reference spectrum R(f) are preferably carried out simultaneously. In such a case, it is advantageously possible to change the test pattern with virtually no additional complexity by changeover of the test pattern generator because the reference spectrum is generated anew for each test pass.

In accordance with an additional mode of the invention, the spectrum X(f) of the memory to be tested is filtered prior to assessment to extract, in particular, those frequency components that are characteristic of a possible malfunction of the memory. In the case of a cyclic read-out of the test area with a cycle duration T, these are, in particular, frequencies corresponding to the inverse cycle duration $T^{-1}$, and harmonics and subharmonics of these frequencies.

In such a case, the filtered-out frequency components can be used directly in the assessment of the memory, a memory being deemed to be defect-free if the magnitudes of the associated amplitudes do not exceed a predetermined limit value $\lambda$.

In accordance with yet another mode of the invention, the test-result-generating step is carried out to generate a two-alternative test result by filtering the spectrum with a filter function and outputting a first of the alternatives for the test result if the following holds true for a predetermined limit value in a selected frequency range:

$$|X(f) \cdot F(f)| \leq \lambda,$$

where, X(f) designates the spectrum, $\lambda$ designates the predetermined limit value, and F(f) designates the filter function, and, otherwise, outputting a second of the alternatives for the test result.

In accordance with yet a further mode of the invention, the test-result-generating step is carried out to generate a two-alternative test result by filtering the spectrum with a filter function and outputting a first of the alternatives for the test result if the following holds true for a predetermined limit value in a selected frequency range:

$$\int_{f1}^{f2} |X(f) \cdot F(f)| df \leq \lambda,$$

where, X(f) designates the spectrum, $\lambda$ designates the predetermined limit value, F(f) designates the filter function, $f_1$ designates a lower and $f_2$ an upper limit of the selected frequency range, and, otherwise, outputting a second of the alternatives for the test result.

With the objects of the invention in view, there is also provided a method for testing an electronic memory having memory cells, including the steps of combining subsets of the memory cells to form memory blocks and testing the memory blocks at least partly simultaneously by selecting a memory block, sequentially reading out content of the memory cells in the selected memory block in a defined order through a common output to present the read out content at the output as a time-dependent signal, Fourier transforming the time-dependent signal into a spectrum, and generating a test result in a manner dependent on the spectrum.

With the objects of the invention in view, there is also provided a test device for testing an electronic memory having memory cells defining memory areas, including a read out device sequentially reading out content of the memory cells in at least one of the memory areas in a defined order and outputting the read out content as a time-dependent signal, at least one Fourier transformation unit connected to the read out device, the at least one Fourier transformation unit adapted to receive the time-dependent signal in a predetermined order with respect to time and adapted to Fourier transform the time-dependent signal into a spectrum and output the spectrum, and an evaluation unit connected to the at least one Fourier transformation unit, the evaluation unit adapted to receive the spectrum and generate a test result dependent upon the spectrum.

A test device for a test method according to the invention includes a test pattern generator, a Fourier transformation unit, and an evaluation unit. In such a case, the test pattern generator is connected to the memory to be tested and, at the beginning of the test, writes a predetermined test pattern to the memory. The memory cells are connected to the Fourier transformation unit through a common output through which the memory content of the memory cells to be tested is transmitted, as described, as time-dependent signal x(t) to the Fourier transformation unit. The Fourier transformation unit generates from the time-dependent signal x(t) the spectrum X(f), which is transmitted to the evaluation unit through the output channel of the Fourier transformation unit. The evaluation unit generates the test result using the spectrum X(f).

The evaluation unit preferably contains a reference generator, a subtractor, and a comparator, the subtractor having two input channels, of which one is connected to the reference generator and the other is connected to the Fourier transformation unit. The subtractor, for example, in the form of a differential amplifier, determines a difference spectrum D(f) from the test spectrum X(f) and the reference spectrum R(f). The comparator compares the difference spectrum with a predetermined limit value integrally or using individual frequency components and, thus, generates a test result, for example, in binary form as "GOOD" or "DEFECTIVE", depending on whether or not the predetermined limit value is exceeded.

In accordance with yet an added feature of the invention, the reference generator has a data generator and a reference Fourier transformation unit, the construction of the reference Fourier transformation unit preferably corresponding to the construction of the Fourier transformation unit. The data generator generates a data stream that corresponds to the test pattern and is fed into the reference Fourier transformation unit as time-dependent reference signal r(t). As an alternative, the data stream of the test pattern generator can also be introduced directly into the reference Fourier transformation unit. The reference Fourier transformation unit generates from the time-dependent signal r(t) a reference spectrum R(f) that, as already described, is used for the assessment of the memory.

In accordance with yet an additional feature of the invention, the evaluation unit contains a frequency filter and a comparator. The frequency filter extracts, from the test spectrum X(f) generated by Fourier transformation, those frequency components that are characteristic of a malfunction of the memory. The comparator determines the test result by comparing the associated amplitudes with a predetermined limit value.

The invention is suitable, in particular, for testing semiconductor memories. Such semiconductor memories generally have one or more semiconductor chips. In the case of the invention, it is advantageously possible for the test device to be at least partly co-integrated on a semiconductor chip.

With the objects of the invention in view, there is also provided a semiconductor chip, including a semiconductor memory having memory cells defining memory areas and at least one semiconductor chip connected to the semiconductor memory, the at least one semiconductor chip having an at least partly integrated test device for testing the memory, the test device having a read out device sequentially reading out content of the memory cells in at least one of the memory areas in a defined order and outputting the read out content as a time-dependent signal, at least one Fourier transformation unit connected to the read out device, the at least one Fourier transformation unit adapted to receive the time-dependent signal in a predetermined order with respect to time and adapted to Fourier transform the time-dependent signal into a spectrum and output the spectrum, and an evaluation unit connected to the at least one Fourier transformation unit, the evaluation unit adapted to receive the spectrum and generate a test result dependent upon the spectrum.

As an alternative, the test device or parts thereof, for example, as separate test chip, and the memory to be tested can be applied on a common carrier or be enclosed by a common housing or a common encapsulation.

Other features that are considered as characteristic for the invention are set forth in the appended claims.

Although the invention is illustrated and described herein as embodied in a test method and test device for electronic memories, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 1 is a block flow diagram of an exemplary embodiment of a test method according to the invention;

FIG. 2 a block circuit diagram of a first exemplary embodiment of a test device according to the invention; and FIG. 3 a block circuit diagram of a second exemplary embodiment of a test device according to the invention.

DESCRIPTION OF THE PREFERRED EMBODIMENTS

In the figures of the drawings, unless stated otherwise, identical reference symbols denote identical parts.

Referring now to the figures of the drawings in detail and first, particularly to FIG. 1 thereof, there is shown the beginning of the test method, at which the test pattern generator 3 writes a test pattern to a selected memory area 5 of the memory 2 to be tested (DUT, device under test). This memory area 5 may be either a partial area or the totality of all the memory cells of the memory 2 to be tested. In the case of memory components, it is particularly advantageous for the test pattern generator 2 to be concomitantly integrated into the component, so that there is no need for external synchronization between the test pattern generator and the memory. Furthermore, the test pattern generator can also be used for other conventional test methods, so-called BISTs (Built In Self Test).

In the case of a test pattern generator integrated into the memory component, the test method can be initialized for example as follows: the memory is switched to the test mode through corresponding inputs of the component, afterward a specific test pattern stored in the test pattern generator is selected, and a write command is transmitted to the memory component, which causes the test pattern to be written to a specific memory area.

In the next step, the selected memory area 5, as indicated (6), is cyclically read a number of times and the content of the memory cells is output serially at the output 7. By way of example, as illustrated, the memory cells may be occupied by an alternating sequence of 1 and 0, so that a constant data stream of the form:

...1010101Z101...

is output at the output 7, where "Z" designates the content of a possibly defective memory cell. From a temporal standpoint, the data stream represents a square-wave signal whose fundamental frequency corresponds to the read-out frequency $f_0$. The monofrequency square-wave signal is disturbed in defective memory cells. For Z=1, for example, the disturbance lies in superposition of the square-wave signal with a further square-wave signal whose frequency is equal to the cycle frequency $f_1=T^{-1}$ with which the selected memory area 5 is run through because the memory error (Z=1) occurs exactly once during each pass of the selected memory area. T designates the time required for a pass of the memory area.

Afterward, the time-dependent signal x(t) present at the output 7 is subjected to a Fourier transformation and the spectrum X(f) is generated. In the example illustrated, the spectrum has a main component with the frequency $f_0$ that corresponds to the read-out frequency of the memory. In the case of a memory error, a component with the cycle frequency $f_1$ is added, which does not occur in the case of a defect-free memory.

Afterward, the spectrum X(f) is assessed and the test result is generated therefrom. In the example illustrated, such an assessment can be effected using the amplitude of the cycle frequency $f_1$, the level of which is significant for a memory error. If the magnitude of the amplitude is greater than a predetermined limit value $\lambda$, then the memory is assessed as defective, otherwise, it is assessed as defect-free. This type of assessment corresponds to a filtering of the spectrum, the frequency component with the cycle frequency $f_1$ being extracted.

To determine a suitable limit value $\lambda$, it is possible to use spectra of memories that have been pretested by a conventional test method. In such a case, the value $\lambda$ is defined such that a pretested defect-free memory is assessed as "GOOD" and a pretested defective memory is assessed as "DEFECTIVE".

It is possible to achieve a further increase in the reliability of the test method by carrying out the test method a number of times with memory areas 5 of different sizes. Such a variation of the area size alters the cycle frequency $f_1$ for a fixed read-out frequency. A memory error is identified with high reliability from the fact that in each case a frequency component with the correspondingly altered cycle frequency occurs. Such a process reduces the risk of defect-free memories being assessed as defective on account of measurement artifacts because such artifacts are generally independent of the selected size of the memory area.

As an alternative to the described assessment using filtered-out frequency components such as, for example, the cycle frequency, it is also possible to generate a reference spectrum R(f) of the test pattern generated by the test pattern generator or the time-dependent signal r(t) corresponding to the test pattern and to subtract it from the test spectrum X(f) to form a difference spectrum D(f). The memory is then assessed using the difference spectrum D(f). Such a process can be done, for example, by a test result "GOOD" being output if the following holds true for a predetermined limit value $\lambda$ within the frequency range $f_1 \leq f \leq f_2$ considered:

$$|D(f)| \leq \lambda.$$

Otherwise, the test result "DEFECTIVE" is generated.

As an alternative, it is also possible to use the integral of the difference spectrum D(f) for assessment. To that end, a memory is assessed as "GOOD" if the relationship $$\int_{f1}^{f2} |D(f)| df \leq |\lambda|,$$

is satisfied, otherwise the memory is deemed to be "DEFECTIVE".

A further advantageous variant of the test method lies in dividing the memory to be tested into a plurality of memory blocks preferably of the same size and testing these memory blocks by one of the methods described. In such a case, it is also possible to test a plurality of blocks simultaneously. As a result, the test time can advantageously be reduced further.

In addition, blockwise testing of the memory enables localization of any memory defects through assignment of the block in which the memory defect occurs.

Such localization is advantageous in the case of the methods described because these methods, in contrast to a conventional test method in which the content of the memory cells is compared directly with the given test pattern, rapidly detect a memory defect without localizing the latter more precisely.

More extensive localization of any memory defect is possible by successively reducing the block size in the case of defective blocks, the associated increase in the cycle frequency $f_1$ for a fixed read-out frequency additionally increasing the reliability of the test result.

FIG. 2 schematically shows a block diagram of a test device according to the invention. The test pattern generator 3 serves to generate test patterns, i.e., data records that are written to the memory 2 to be tested, for the purpose of the tests, and are subsequently output. Such data records can be calculated algorithmically according to a computation specification or preferably be stored in a memory contained in the test pattern generator 3 and be read out from the memory 2. The test pattern generator 3 is connected to the memory 2 to be tested and, at the beginning of the test, writes a predetermined test pattern to a selected memory area 5.

The memory 2 subsequently outputs the content of the memory cells situated in the selected memory area 5 through a common output 7. To that end, by way of example, an address counter is continuously incremented and the content of the respectively addressed memory cell is read out. A non-illustrated clock generator controls the read-out frequency or the clock for the incrementing. Preferably, in the case of corresponding memory components, address counter and clock generator are concomitantly integrated into the component.

More extensively, the test pattern generator can also advantageously be contained in the component. Such a configuration enables particularly simple and cost-effective testing of the memory because the test sequence only has to be initialized through an input of the memory component and afterward the memory component independently outputs the test pattern serially as time-dependent signal x(t) at the output 7.

The output 7 is connected to the Fourier transformation unit 1. The Fourier transformation unit 1 transforms the signal x(t) into the associated spectrum X(f). Suitable hard-wired circuits or suitable sampling devices that subsequently determine the Fourier transformation by a data processing program, for example, using an FFT algorithm, can be used as the Fourier transformation unit. Such Fourier transformation units are in the prior art and are not described in any further detail here. Storage oscilloscopes in which the corresponding functions for Fourier transformation are implemented arc particularly suitable for such an application.

The Fourier transformation unit is connected to the evaluation unit 4 through an output channel 8 and transmits the determined spectrum X(f) through the latter. In the exemplary embodiment shown, the evaluation unit contains a reference unit 10 including a data generator 9 and a reference Fourier transformation unit 14, a subtractor 11, and a comparator 12. The subtractor 11 has a first and a second input channel and is connected to the output channel 8 of the Fourier transformation unit through the first input channel and to the output channel 13 of the reference unit 10 by the second input channel.

The subtractor 11 forms, from the test spectrum X(f) and a reference spectrum R(f) generated by the reference unit, a difference spectrum D(f), for example, in accordance with the following specification:

$$D(f)=X(f)-R(f).$$

The difference spectrum D(f) is transmitted to the comparison unit 12 through the output channel 17 of the subtractor 11. The comparison unit compares the difference spectrum with defined limit values and outputs at the output 15 of the evaluation unit 4 a test result "GOOD" or "DEFECTIVE", depending on whether the difference spectrum lies below or above the defined limit values.

The reference unit 10 includes a data generator 9, which generates a sequential data stream in the form of a time-dependent reference signal r(t), which corresponds to the expected data stream in the case of a defect-free memory at the output 7. The data stream is fed into the reference Fourier transformation unit 14, which generates therefrom the associated reference spectrum R(f), which is transmitted to the subtractor 11 through the output channel 13 of the reference unit 10. The reference Fourier transformation unit 14 and the Fourier transformation unit 1 preferably have the same construction.

As an alternative, the reference unit 10 may also include, in a manner that is not illustrated, a reference memory in which reference spectra are stored. The latter can be generated, as already described, by a test spectrum of a pretested, defect-free memory.

All of these components can be integrated into one semiconductor chip 18.

FIG. 3 shows a further exemplary embodiment of a test device according to the invention. A variant of the evaluation unit 4 is illustrated. In contrast to the previously described exemplary embodiment, the evaluation unit 4 includes a frequency filter 16, whose output is connected to a comparator 12.

Firstly those frequency components that are characteristic of a memory malfunction, for example, the above-described cycle frequency $f_1$ and the harmonics thereof, are filtered out from the test spectrum X(f) by the filter 16. The comparator compares the associated amplitude or the magnitude thereof with predetermined limit values and outputs a test result "GOOD" if the limit values are not exceeded, otherwise, the memory is assessed as "DEFECTIVE".

It goes without saying that the explanation of the invention using the exemplary embodiments described is not to be understood as a restriction of the invention thereto.

We claim:

1. A method for testing an electronic memory having memory cells, which comprises:
    selecting a memory area of the memory, the memory area including at least some of the memory cells;
    sequentially reading out a test pattern stored in the memory cells in the selected memory area in a defined order through a common output to present at the common output the test pattern as a time-dependent signal;
    Fourier transforming the time-dependent signal into a spectrum dependent upon the test pattern;
    generating a test result that is dependent on the spectrum; and
    carrying out the test-result-generating step to generate a two-alternative test result by:
    forming a difference spectrum from the spectrum and a reference spectrum in a selected frequency range; and
    outputting a first of the alternatives for the test result if the following holds true for a predetermined limit value in the selected frequency range:

$|D(f)| \leq \lambda$, where, D(f) designates the difference spectrum and $\lambda$ designates the predetermined limit value, and, otherwise, outputting a second of the alternatives for the test result.

2. The method according to claim 1, which further comprises:
    generating a test pattern with a test pattern generator; and
    writing the test pattern to the selected memory area prior to sequentially reading out the test pattern stored in the memory cells in the selected memory area.

3. The method according to claim 1, which further comprises carrying out the Fourier transformation with a hard-wired circuit.

4. The method according to claim 1, which further comprises:
    for the Fourier transformation, temporally sampling and buffer-storing the time-dependent signal; and
    subsequently determining the spectrum from the temporally sampled and buffer-stored time-dependent signal with a data processing program.

5. The method according to claim 1, which further comprises:
    carrying out the Fourier transformation step by temporally sampling and buffer-storing the time-dependent signal; and
    subsequently determining the spectrum from the temporally sampled and buffer-stored time-dependent signal with a data processing program.

6. The method according to claim 1, which further comprises:
    sampling the time-dependent signal with a storage oscilloscope; and
    Fourier-transforming the time-dependent signal into the spectrum.

7. The method according to claim 1, which further comprises carrying out the sequentially reading out step by cyclically reading the selected memory area a number of times.

8. The method according to claim 1, which further comprises using the spectrum of a pretested, defect-free memory as the reference spectrum.

9. The method according to claim 1, which further comprises:
    generating a test pattern with a test pattern generator;
    writing the test pattern to the selected memory area prior to reading out the content of the memory cells; and
    generating the reference spectrum by:
        sequentially reading out the test pattern from an output of the test pattern generator in a temporal order corresponding to the sequential reading out step to present the test pattern at the output of the test pattern generator as a time-dependent reference signal; and
        Fourier transforming the reference signal into the reference spectrum.

10. The method according to claim 1, which further comprises determining the predetermined limit value by a comparison of the spectra of a pretested defective memory and a pretested defect-free memory.

11. A method for testing an electronic memory having memory cells, which comprises:
    selecting a memory area of the memory, the memory area including at least some of the memory cells;
    sequentially reading out a test pattern stored in the memory cells in the selected memory area in a defined order through a common output to present at the common output the test pattern as a time-dependent signal;
    Fourier transforming the time-dependent signal into a spectrum dependent upon the test pattern; and generating a test result that is dependent on the spectrum;
carrying out the test-result-generating step to generate a two-alternative test result by:
forming a difference spectrum from the spectrum and a reference spectrum in & selected frequency range; and
outputting a first of the alternatives for the test result if the following holds true for a predetermined limit value in the selected frequency range:

$$\int_{f1}^{f2} |D(f)| df \le \lambda,$$

where, D(f) designates the difference spectrum, $\lambda$ designates the predetermined limit value, $f_1$ designates a lower and $f_2$ an upper limit of the selected frequency range, and, otherwise, outputting a second of the alternatives for the test result.

12. The method according to claim 11, which further comprises using the spectrum of a pretested, defect-free memory as the reference spectrum.

13. The method according to claim 11, which further comprises:
generating a test pattern with a test pattern generator;
writing the test pattern to the selected memory area prior to reading out the content of the memory cells; and
generating the reference spectrum by:
sequentially reading out the test pattern from an output of the test pattern generator in a temporal order corresponding to the sequential reading out step to present the test pattern at the output of the test pattern generator as a time-dependent reference signal; and
Fourier transforming the reference signal into the reference spectrum.

14. The method according to claim 11, which further comprises determining the predetermined limit value by a comparison of the spectra of a pretested defective memory and a pretested defect-free memory.

15. A method for testing an electronic memory having memory cells, which comprises:
selecting a memory area of the memory, the memory area including at least some of the memory cells;
sequentially reading out a test pattern stored in the memory cells in the selected memory area in a defined order through a common output to present at the common output the test pattern as a time-dependent signal;
Fourier transforming the time-dependent signal into a spectrum dependent upon the test pattern; and
generating a test result that is dependent on the spectrum;
carrying out the test-result-generating step to generate a two-alternative test result by:
filtering the spectrum with a filter function; and
outputting a first of the alternatives for the test result if the following holds true for a predetermined limit value in a selected frequency range:

$|X(f) \cdot F(f)| \le \lambda,$ where, X(f) designates the spectrum, $\lambda$ designates the predetermined limit value, and F(f) designates the filter function, and, otherwise, outputting a second of the alternatives for the test result.

16. A method for testing an electronic memory having memory cells, which comprises:
selecting a memory area of the memory, the memory area including at least some of the memory cells;
sequentially reading out a test pattern stored in the memory cells in the selected memory area in a defined order through a common output to present at the common output the test pattern as a time-dependent signal;
Fourier transforming the time-dependent signal into a spectrum dependent upon the test pattern; and
generating a test result that is dependent on the spectrum;
carrying out the test-result-generating step to generate a two-alternative test result by:
filtering the spectrum with a filter function; and
outputting a first of the alternatives for the test result if the following holds true for a predetermined limit value in a selected frequency range:

$$\int_{f1}^{f2} |X(f) \cdot F(f)| df \le \lambda,$$

where, X(f) designates the spectrum, $\lambda$ designates the predetermined limit value, F(f) designates the filter function, $f_1$ designates a lower and $f_2$ an uppar limit of the selected frequency range, and, otherwise, outputting a second of the alternatives for the test result.

17. A test device for testing an electronic memory having memory cells defining memory areas, the memory cells in at least a selected memory area storing a test pattern, comprising:
an evaluation unit including the memory cells having the test pattern;
at least one Fourier transformation unit connected to said evaluation unit such that the test pattern is sent as a time-dependent signal to said Fourier transformation unit in a predetermined order with respect to time, said at least one Fourier transformation unit generating a spectrum dependent on the test pattern from the time-dependent signal and transferring the spectrum to said evaluation unit, said evaluation unit generating the test pattern dependent upon the spectrum.

18. The test device according to claim 17, including at least one test pattern generator.

19. The test device according to claim 18, wherein said at least one test pattern generator writes the test pattern to the memory cells in at least one of the memory areas and said at least one Fourier transformation unit.

20. The test device according to claim 19, wherein said evaluation unit has:
a reference generator adapted to generate a reference spectrum;
a subtractor connected to said reference generator and adapted to generate a difference spectrum dependent upon said spectrum and said reference spectrum; and
a comparator adapted to determine said test result dependent upon said difference spectrum.

21. The test device according to claim 20, wherein said reference generator has:
a data generator adapted to generate a time-dependent reference signal corresponding to said test pattern; and
a reference Fourier transformation unit connected to said data generator and adapted to generate said reference spectrum from said time-dependent reference signal.

22. The test device according to claim 21, wherein said evaluation unit has:
a frequency filter adapted to extract individual frequency components from said spectrum; and a comparator connected to said frequency filter and adapted to determine said test result dependent upon amplitudes of said frequency components.

23. The test device according to claim 17, wherein the electronic memory is a semiconductor memory with at least one semiconductor chip.

24. A semiconductor chip, comprising:
a semiconductor memory having memory cells defining memory areas ; and
at least one semiconductor chip connected to said semiconductor memory, said at least one semiconductor chip having an at least partly integrated test device for testing said memory, said test device having:
   a read out device sequentially reading out content of said memory cells in at least one of said memory areas in a defined order and outputting the read out content as a time-dependent signal;
   at least one Fourier transformation unit connected to said read out device, said at least one Fourier transformation unit:
      adapted to receive said time-dependent signal in a predetermined order with respect to time; and
      adapted to Fourier transform the time-dependent signal into a spectrum and output said spectrum; and
   an evaluation unit connected to said at least one Fourier transformation unit, said evaluation unit adapted to receive said spectrum and generate a test result dependent upon said spectrum.

25. The chip according to claim 24, including at least one test pattern generator.

26. The chip according to claim 25, wherein said at least one test pattern generator writes a test pattern to at least one of said memory and said at least one Fourier transformation unit.

27. The chip according to claim 26, wherein said evaluation unit has:
   a reference generator adapted to generate a reference spectrum;
   a subtractor connected to said reference generator and adapted to generate a difference spectrum dependent upon said spectrum and said reference spectrum; and
   a comparator adapted to determine said test result dependent upon said difference spectrum.

28. The chip according to claim 27, wherein said reference generator has:
   a data generator adapted to generate a time-dependent reference signal corresponding to said test pattern; and
   a reference Fourier transformation unit connected to said data generator and adapted to generate said reference spectrum from said time-dependent reference signal.

29. The chip according to claim 28, wherein said evaluation unit has:
   a frequency filter adapted to extract individual frequency components from said spectrum; and
   a comparator connected to said frequency filter and adapted to determine said test result dependent upon amplitudes of said frequency components.

30. The chip according to claim 24, including a common carrier, said test device being applied with said semiconductor chip to said common carrier.

31. The chip according to claim 24, including a common housing, said test device being incorporated with said semiconductor chip into said common housing.

* * * * *